(12) United States Patent
Shiga et al.

(10) Patent No.: US 7,385,836 B2
(45) Date of Patent: Jun. 10, 2008

(54) FERROELECTRIC RANDOM ACCESS MEMORY

(75) Inventors: Hidehiro Shiga, Kawasaki (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/265,188

(22) Filed: Nov. 3, 2005

(65) Prior Publication Data

US 2007/0047288 A1 Mar. 1, 2007

(30) Foreign Application Priority Data

Aug. 23, 2005 (JP) ............... 2005-241260

(51) Int. Cl.
*G11C 11/22* (2006.01)

(52) U.S. Cl. .................. 365/145; 365/189.11
(58) Field of Classification Search ................ 365/145, 365/189.11
See application file for complete search history.

(56) References Cited

U.S. PATENT DOCUMENTS

| | | | |
|---|---|---|---|
| 5,539,279 A | * | 7/1996 | Takeuchi et al. ............ 365/145 |
| 6,191,971 B1 | * | 2/2001 | Tanaka et al. .............. 365/145 |
| 6,574,133 B2 | | 6/2003 | Takashima |
| 6,671,199 B2 | * | 12/2003 | Maruyama ................. 365/145 |

FOREIGN PATENT DOCUMENTS

JP 2002-83493 3/2002

OTHER PUBLICATIONS

Daisaburo Takashima, et al., "A 76-mm$^2$ 8-Mb Chain Ferroelectric Memory", IEEE Journal of Solid-State Circuits, vol. 36, No. 11, Nov. 2001, pp. 1713-1720.

* cited by examiner

*Primary Examiner*—Amir Zarabian
*Assistant Examiner*—Kretelia Graham
(74) *Attorney, Agent, or Firm*—Oblon, Spivak, McClelland, Maier & Neustadt, P.C.

(57) ABSTRACT

A reference bit line which supplies a reference potential to a sense amplifier circuit is connected to the sense amplifier circuit. A reference potential generating circuit is connected to the reference bit line. The reference potential generating circuit includes a selection transistor which is connected at one end to the reference bit line, and a paraelectric capacitor connected between the other end of the selection transistor and a dummy plate line. A dummy plate line driver is connected to the dummy plate line. The dummy plate line driver drives the dummy plate line to a first voltage which is higher than an operating voltage of the sense amplifier circuit, when the reference potential generating circuit generates the reference potential.

8 Claims, 3 Drawing Sheets

FERROELECTRIC RANDOM ACCESS MEMORY

CROSS-REFERENCE TO RELATED APPLICATIONS

This application is based upon and claims the benefit of priority from prior Japanese Patent Application No. 2005-241260, filed Aug. 23, 2005, the entire contents of which are incorporated herein by reference.

BACKGROUND OF THE INVENTION

1. Field of the Invention

The present invention relates to a ferroelectric semiconductor memory using a ferroelectric capacitor. In particular, the present invention relates to a ferroelectric semiconductor memory having a reference potential generating circuit which generates a reference potential used when data is sensed by a sense amplifier circuit.

2. Description of the Related Art

As non-volatile semiconductor memories, known are ferroelectric random access memories (FeRAM) using a ferroelectric capacitor. In FeRAMs, one memory cell is formed of a selection transistor which is connected at one end to a bit line, and a ferroelectric capacitor which is connected between the other end of the selection transistor and a plate line.

In FeRAMs, data "1" or data "0" is stored according to the polarization direction of the ferroelectric capacitor. Suppose that data "1" is written in the memory cell, if a potential of the plate line is increased when the selection transistor is in an ON state and the memory cell is selected, the amount of electric charge flowing from the ferroelectric capacitor into the bit line increases, and a potential of the bit line greatly rises. In the meantime, suppose that data "0" is written in the memory cell, if the potential of the plate line is increased when the memory cell is selected, the amount of electric charge flowing from the ferroelectric capacitor into the bit line is smaller than that in the case of data "1", and rise in potential of the bit line is smaller than in the case of data "1". When data is read from a memory cell, the sense amplifier circuit compares the magnitude of the potential of the bit line with that of the reference bit line, and determines whether the read data is "1" or "0", on the basis of the comparison result. The reference bit line is supplied with a reference potential which has an intermediate value between the above two potentials of the bit line.

Various types have been proposed as a reference potential generating circuit which generates the reference potential. Among them, there is a type in which a memory cell whose a ferroelectric capacitor is replaced by a paraelectric capacitor is used as the reference potential generating circuit. The selection transistor is connected at one end to the reference bit line, and the paraelectric capacitor is connected between the other end of the selection transistor and a dummy plate line.

The following is the reason why a paraelectric capacitor is used for the reference potential generating circuit, not a ferroelectric capacitor as used in the memory cell. Ferroelectric capacitors cannot stably generate a reference potential for the following defects: ferroelectric capacitors greatly vary in capacitance; ferroelectric capacitors fatigue through polarization inversion and capacitance change; capacitance of ferroelectric capacitors reduces through polarization; and imprint is caused to change the property thereof.

In the reference potential generating circuit having the above structure, when the potential of the dummy plate line is raised from 0V to VDC, the potential of the reference bit line rises. The capacitance of the paraelectric capacitor and the value of the VDC are controlled such that the potential of the reference bit line obtained by this rise becomes a desired reference potential.

However the area of the paraelectric capacitor causes problems. Generally, an MOS structure is used for paraelectric capacitors. The gate insulating film material of MOS structure has a very small dielectric constant being $1/100$ to $1/1000$ of that of a ferroelectric capacitor. Therefore, to obtain a reference potential of a certain value or more, it is necessary to greatly increase the area of the paraelectric capacitor and consequently the area occupied by the reference potential generating circuit. This increases the area of the chip.

A reference potential generating circuit comprising a paraelectric capacitor and a selection transistor is disclosed in, for example, Jpn. Pat. Appln. KOKAI Pub. No. 2002-83493 (FIG. 18).

BRIEF SUMMARY OF THE INVENTION

According to an aspect of the present invention, there is provided a ferroelectric random access memory comprising: a reference bit line connected to a sense amplifier circuit and supplying a reference potential to the sense amplifier circuit; a reference potential generating circuit which includes a transistor and a paraelectric capacitor, the transistor having one end and the other end and the one end connected to the reference bit line, and the paraelectric capacitor connected between the other end of the transistor and a dummy plate line, and generates the reference potential; and a drive circuit which is connected to the dummy plate line, and drives the dummy plate line to a first voltage higher than an operating voltage of the sense amplifier circuit when the reference voltage generating circuit generates the reference potential.

DETAILED DESCRIPTION OF THE INVENTION

The present invention is explained by embodiments below with reference to drawings.

Figure 1:
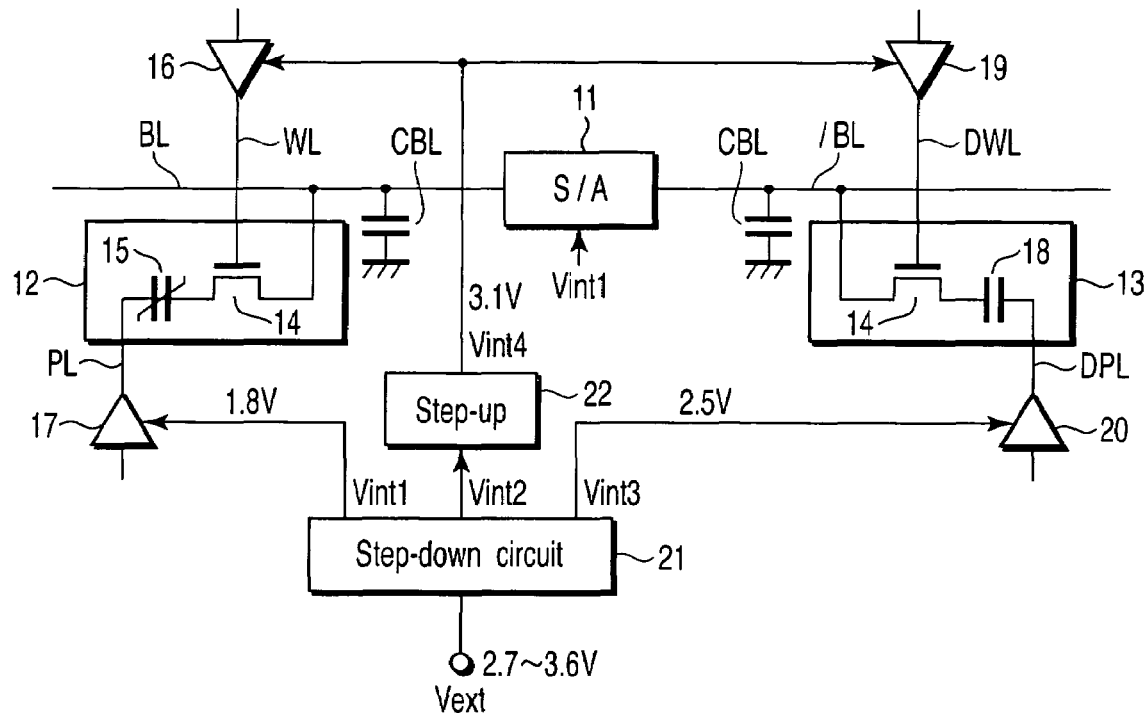
FIG. 1 is a schematic circuit diagram of a ferroelectric memory according to a first embodiment of the present invention.

FIG. 1 illustrates a structure of a main part of a ferroelectric memory according to a first embodiment of the present invention.

A sense amplifier circuit (S/A) 11 is connected with a bit line BL and a reference bit line /BL. Each of the bit line BL and the reference bit line /BL has a parasitic capacitance, which is denoted by "CBL" in FIG. 1. A memory cell 12 is connected to the bit line BL, and a reference potential generating circuit 13 is connected to the reference bit line /BL. When data is read from the memory cell 12, the sense amplifier circuit 11 compares a potential of the bit line BL and a reference potential applied to the reference bit line /BL, and determines whether the read data is "1" or "0".

The memory cell 12 comprises a selection transistor 14, which is formed of an N-channel transistor connected at one end to the bit line BL, and a ferroelectric capacitor 15 which is connected between the other end of the selection transistor 14 and a plate line PL. A gate electrode of the selection transistor 14 is connected to a word line WL. The word line WL is driven by a word line driver 16. The plate line PL is driven by a plate line driver 17.

The reference potential generating circuit 13 has a structure obtained by replacing the ferroelectric capacitor 15 in the memory cell 12 by a paraelectric capacitor 18. Specifically, the reference potential generating circuit 13 comprises a selection transistor 14, which is connected at one end to the reference bit line /BL, and a paraelectric capacitor 18 connected between the other end of the selection transistor 14 and a dummy plate line DPL. A gate electrode of the selection transistor 14 is connected to a dummy word line DWL. The dummy word line DWL is driven by a dummy word line driver 19. The dummy plate line DPL is driven by a dummy plate line driver 20.

The plate line driver 17 that drives the plate line PL and the sense amplifier circuit 11 are operated with a normal voltage. In comparison with this, the dummy plate line driver 20 that drives the dummy plate line DPL is operated with a voltage higher than the normal voltage for the driver 17 and the sense amplifier circuit 11. Thereby, even if the size of the paraelectric capacitor 18 is reduced, the reference potential generating circuit 13 can generate a reference potential at the same level as in the conventional structure.

A step-down circuit 21 is provided in the chip, to deal with an external power supply voltage Vext of various values. As a voltage to be supplied to the dummy plate line driver 20, used is a maximum internal voltage Vint3 which is stably obtained by stepping down the external power supply voltage Vext by the step-down circuit 21. When the external power supply voltage Vext ranges from 2.7 V to 3.6 V, a value of the maximum internal voltage Vint3 obtained by the step-down circuit 21 is, for example, 2.5 V. Further, the step-down circuit 21 generates, for example, two internal voltages Vint1 and Vint2, which are smaller than the Vint3. A value of the internal voltage Vint1 is 1.8 V, for example, and a value of the internal voltage Vint2 falls within the range of 1.8 V to 2.5 V.

Suppose that a film thickness of a gate insulating film of an MOS transistor forming an internal circuit is 6 nm. In view of the withstand voltage of the gate insulating film, the maximum voltage that can be applied to a gate electrode is limited to 3.1 V. The voltage of 3.1 V is obtained as an internal voltage Vint4, by stepping-up one of the three types of internal voltages generated by the step-down circuit 21, for example, Vint2 by a step-up circuit 22. To sufficiently heighten the voltage of data "1" rewrite in the memory cell 12, the internal voltage Vint4 having a value of 3.1 V is supplied to the word line driver 16 and the dummy word line driver 19, which drive the word line WL and the dummy word line DWL connected with the gate electrodes of the selection transistors 14, respectively. It is necessary to set the voltage amplitude of the bit line BL, that is, an operating voltage of the sense amplifier circuit 11 to a value which is not influenced by threshold voltage drop of the selection transistor 14. Therefore, as the operating voltage, the sense amplifier circuit 11 is supplied with the internal voltage Vint1, which has a value of 1.8 V lower by 1.3 V (corresponding to the threshold voltage of the selection transistor) than the internal voltage Vint4 having a value of 3.1 V. Specifically, the operating voltage (Vint3) of the dummy plate line driver 20 that drives the dummy plate line DPL is higher than the operating voltage (Vint1) of the sense amplifier circuit 11.

Figure 2:
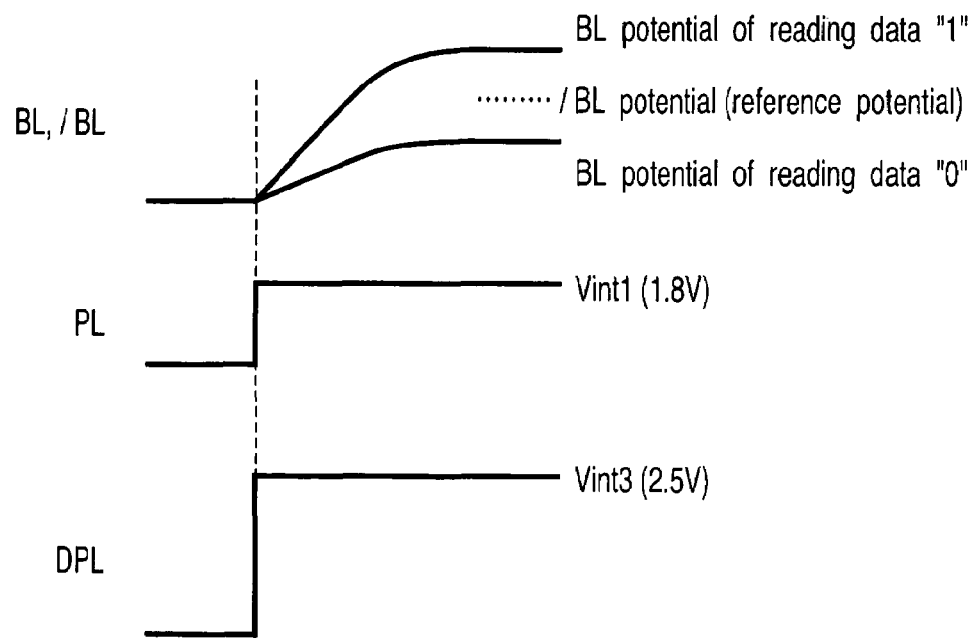
FIG. 2 is a diagram illustrating waveforms in reading data of the ferroelectric memory illustrated in FIG. 1.

Operation of reading data from the memory cell 12 in the ferroelectric memory having the above structure is explained with reference to the waveform diagram of FIG. 2. In data reading, the word line driver 16 drives the word line WL to a high level (Vint4), and thereafter the plate line driver 17 drives the plate line PL to a high level (Vint1). Thereby, the selection transistor 14 in the memory cell 12 is turned on, and electric charge of an amount corresponding to the polarization state of the ferroelectric capacitor 15 flows into the bit line BL. As shown in the waveform diagram of FIG. 2, the potential of the bit line BL in the case of reading data "1" is higher than that in the case of reading data "0".

In the meantime, in the reference potential generating circuit 13, the dummy word line driver 19 drives the dummy word line DWL to a high level (Vint4), and thereafter the dummy plate line driver 20 drives the dummy plate line DPL to a high level (Vint3). Thereby, the selection transistor 14 in the reference potential generating circuit 13 is turned on, and electric charge flows into the reference bit line /BL through the paraelectric capacitor 18. In this operation, as shown in the waveform diagram of FIG. 2, the dummy plate line DPL is driven by the voltage Vint3 (2.5 V) higher than Vint1 (1.8 V). Further, the area of the paraelectric capacitor 18 is adjusted in advance. Thereby, the reference bit line /BL is provided with a reference potential which is intermediate between the BL potential in the case of reading data "1" and the BL potential in the case of reading data "0".

As described above, according to the ferroelectric memory according to the first embodiment, when the reference potential generating circuit 13 generates a reference potential, the dummy plate line DPL is driven by the voltage Vint3 (2.5 V) which is higher than the operating voltage Vint1 (1.8 V) of the sense amplifier circuit 11. Therefore, the reference potential generating circuit 13 can generate a reference potential with the same level as that in the conventional structure, even if the area of the paraelectric capacitor 18 in the reference voltage generating circuit 13 is reduced. Therefore, it is possible to reduce the area of the chip to be smaller than in the conventional structure.

In the first embodiment, explained is the case where the internal voltage Vint2 generated in the step-down circuit 21 is stepped up by the step-up circuit 22 to generate the internal voltage Vint4 which drives the word line WL and the dummy word line DWL. This embodiment can be modified to have a structure in which the maximum internal voltage Vint3 generated in the step-down circuit 21 is stepped up by the step-up circuit 22 to generate the internal voltage Vint4.

Figure 3:
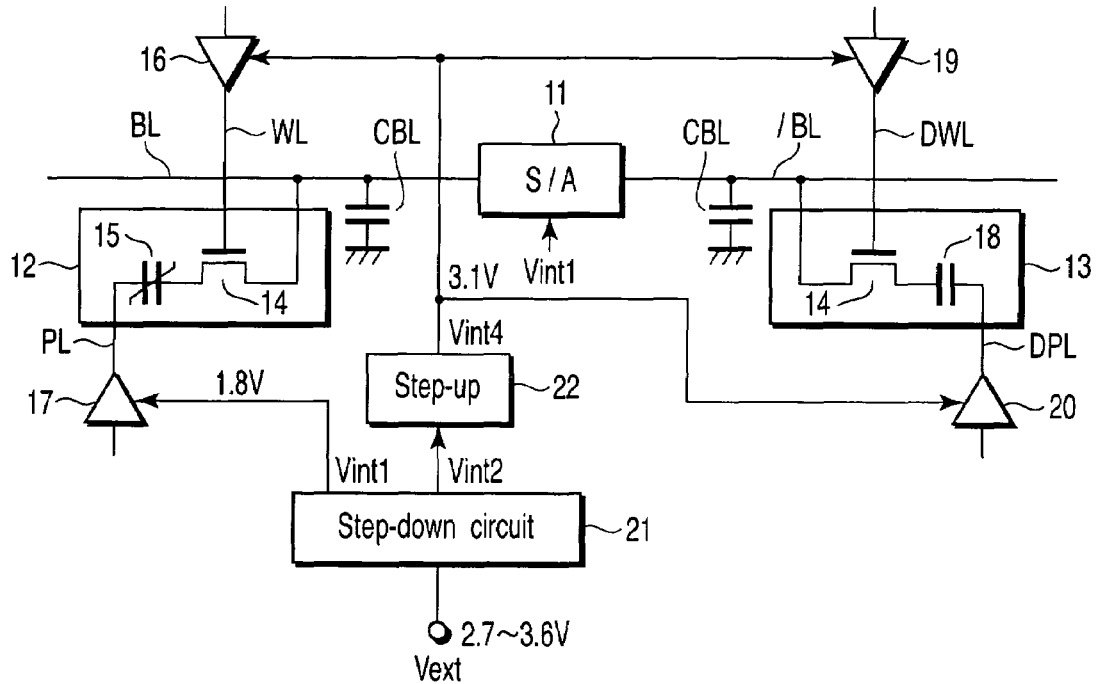
FIG. 3 is a schematic circuit diagram of a ferroelectric memory according to a second embodiment of the present invention.

FIG. 3 illustrates a structure of a main part of a ferroelectric memory according to a second embodiment of the present invention. In the ferroelectric memory of the first embodiment, the maximum internal voltage Vint3 generated by the step-down circuit 21 is supplied to the dummy plate line driver 20 to generate a reference potential of the same level as in the prior art even if the area of the paraelectric capacitor 18 is reduced.

As explained with respect to FIG. 1, the drive voltage for the word line WL and the dummy word line DWL is set to a highest value not exceeding the voltage which the selection transistor 14 can withstand, to prevent threshold voltage drop of the signal in the bit line BL and the reference bit line /BL. Therefore, the memory chip includes the step-up circuit 22. Specifically, the value of the internal voltage Vint4 (3.1 V) generated in the step-up circuit 22 is higher than the internal voltage Vint3 (2.5 V). Therefore, as shown in FIG. 3, the internal voltage Vint4 is generated in the step-up circuit 22. The internal voltage Vint4 is supplied to the dummy plate line driver 20. The dummy plate line DPL is driven with a voltage higher than that in the case of FIG. 1. This allows further reduction in the area of the paraelectric capacitor 18, and achieves further reduction in chip area.

In the meantime, a method of reducing the area of a paraelectric capacitor to ⅓ is disclosed in D. Takashima et al., "A 76-mm² 8-Mb Chain Ferroelectric Memory" IEEE JOURNAL OF SOLID-STATE CIRCUITS, VOL. 36, No. 11, NOVEMBER 2001. In a reference potential generating circuit disclosed in Takashima et al., a precharge transistor is inserted between a precharge node and a junction node between the selection transistor 14 and the paraelectric capacitor 18 in the reference potential generating circuit 13 shown in FIG. 1. The precharge transistor is turned on in advance to precharge the junction node between the selection transistor 14 and the paraelectric capacitor 18, and then the dummy plate line DPL is driven to high level. This enables generation of a reference potential of the same value as in the case of FIG. 1, by using a paraelectric capacitor having a ⅓ area of the capacitor shown in FIG. 1.

Figure 4:
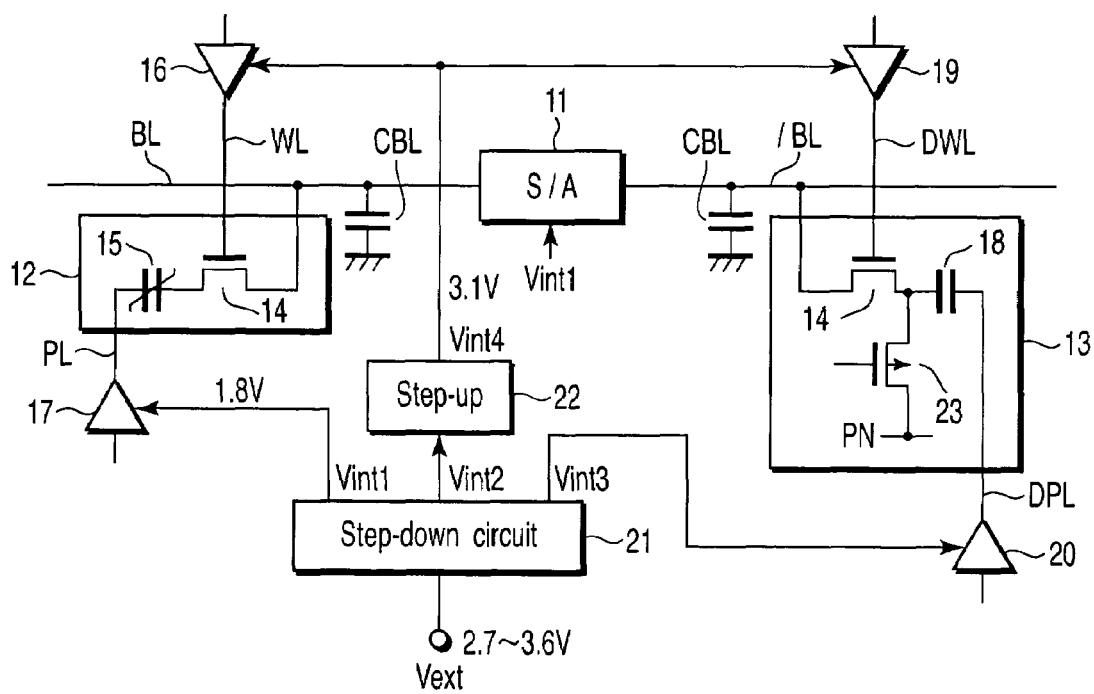
FIG. 4 is a schematic circuit diagram of a ferroelectric memory according to a third embodiment of the present invention.

FIG. 4 illustrates a structure of a main part of a ferroelectric memory according to a third embodiment of the present invention, to which the above principle is applied. A reference potential generating circuit 13 includes a selection transistor 14 connected at one end to a reference bit line /BL, a paraelectric capacitor 18 connected between the other end of the selection transistor 14 and a dummy plate line DPL, and a precharge transistor 23 formed of a P-channel transistor connected between the other end of the selection transistor 14 and a precharge node PN. During a first period before generation of the reference potential, the precharge transistor 23 is turned on to precharge the junction node between the selection transistor 14 and the paraelectric capacitor 18. The maximum internal voltage Vint3 generated in the step-down circuit 21 may be used as a voltage of the precharge node PN, that is, the precharge voltage. During a second period in which the reference potential is generated, the precharge transistor 23 is turned off, and the selection transistor 14 is turned on.

Thereby, it is possible to generate the reference potential of the same value as in the case of FIG. 1, with the paraelectric capacitor 18 having an area smaller than that in the case of FIG. 1.

In the third embodiment, a P-channel transistor with no threshold voltage drop is used as the precharge transistor 23. When the influence of the threshold voltage drop is small, however, an N-channel transistor may be used as the precharge transistor 23.

Figure 5:
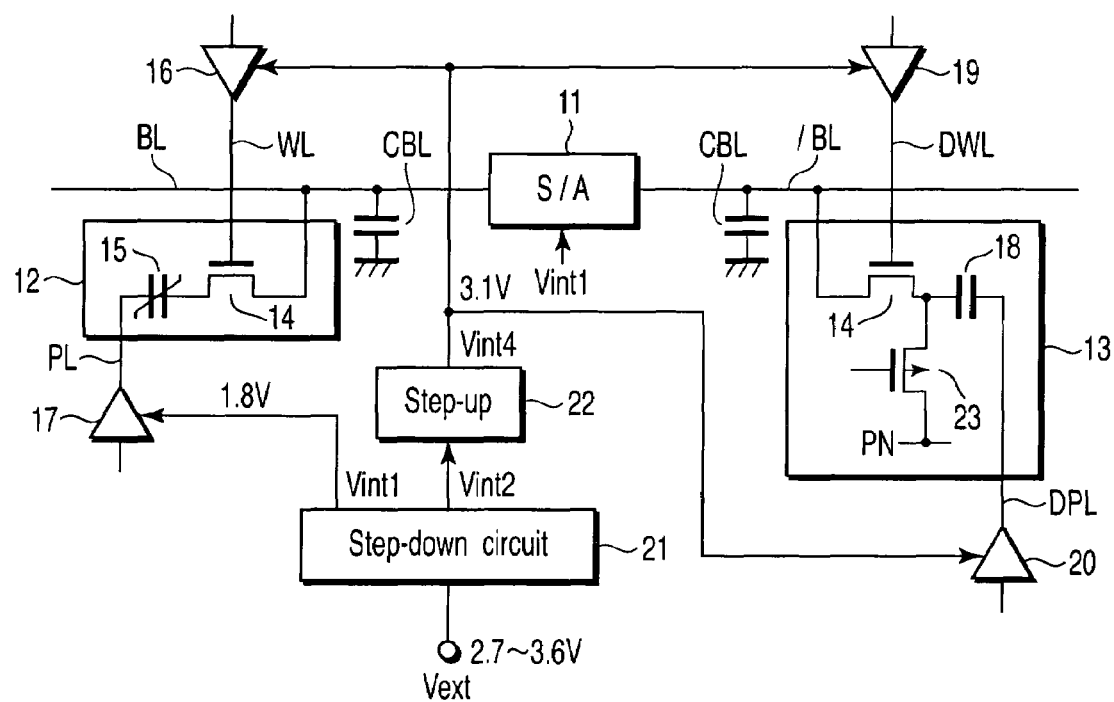
FIG. 5 is a schematic circuit diagram of a ferroelectric memory according to a fourth embodiment of the present invention.

FIG. 5 illustrates a structure of a main part of a ferroelectric memory according to a fourth embodiment of the present invention. In the ferroelectric memory according to the third embodiment, the maximum internal voltage Vint3 generated in the step-down circuit 21 is supplied to the dummy plate line driver 20.

In comparison with this, in the ferroelectric memory according to the fourth embodiment, the internal voltage Vint4 generated in the step-up circuit 22 is supplied to the dummy plate line driver 20, as in the case of the ferroelectric memory according to the second embodiment shown in FIG. 3. Thereby, the dummy plate line DPL is driven with a voltage higher than that in the case of FIG. 4. In this case, the internal voltage Vint4 generated in the step-up circuit 22 may be used as the voltage of the precharge node PN, that is, a precharge voltage.

According to the fourth embodiment, it is possible to further reduce the area of the paraelectric capacitor 18, and further reduce the chip area.

The present invention is not limited to the above embodiments, but can be variously modified as a matter of course. For example, the values of the external power supply voltage Vext and the internal voltages Vint1 to Vint4 explained in the embodiments are only examples, and do not limit the voltages.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric random access memory comprising:
   a reference bit line connected to a sense amplifier circuit and supplying a reference potential to the sense amplifier circuit;
   a reference potential generating circuit which includes a transistor and a paraelectric capacitor, the transistor having one terminal and an other terminal, the one terminal connected to the reference bit line, and the paraelectric capacitor connected between the other terminal of the transistor and a dummy plate line, and generates the reference potential;
   a drive circuit which is connected to the dummy plate line, and drives the dummy plate line to a first voltage higher than an operating voltage of the sense amplifier circuit when the reference voltage generating circuit generates the reference potential;
   a step-down circuit which steps down an external power supply voltage to generate a plurality of internal voltages; and
   a step-up circuit which receives and steps up at least one of the internal voltages generated in the step-down circuit,
   wherein the drive circuit receives a step-up voltage stepped up by the step-up circuit as the first voltage.

2. The ferroelectric random access memory according to claim 1, further comprising:
   a step-down circuit which steps down an external power supply voltage to generate a plurality of internal voltages,
   wherein the drive circuit receives one of the internal voltages as the first voltage.

3. The ferroelectric random access memory according to claim 2,
   wherein the first voltage is an internal voltage having the largest value in the internal voltages.

4. The ferroelectric random access memory according to claim 3, wherein an operating voltage of the sense amplifier circuit is 1.8 V, and the first voltage is 2.5 V.

5. The ferroelectric random access memory according to claim 2, wherein the external power supply voltage is a voltage ranging from 2.7 to 3.6 V, and the first voltage is 2.5 V.

6. The ferroelectric random access memory according to claim 1,
wherein the transistor is an N-channel transistor.

7. The ferroelectric random access memory according to claim 6,
wherein the first voltage is the same voltage as a voltage which drives a gate electrode of the transistor.

8. The ferroelectric random access memory according to claim 7, wherein the first voltage is 3.1 V.

* * * * *